United States Patent
Lee et al.

(10) Patent No.: US 7,435,632 B2
(45) Date of Patent: Oct. 14, 2008

(54) METHOD FOR MANUFACTURING A BOTTOM SUBSTRATE OF A LIQUID CRYSTAL DISPLAY DEVICE

(75) Inventors: Yi-Wei Lee, Hsin-Chu (TW); Ching-Yun Chu, Hsin-Chu (TW)

(73) Assignee: AU Optronics Corp., Hsin-Chu (RW)

( * ) Notice: Subject to any disclaimer, the term of this patent is extended or adjusted under 35 U.S.C. 154(b) by 0 days.

(21) Appl. No.: 11/639,189

(22) Filed: Dec. 15, 2006

(65) Prior Publication Data
US 2007/0155034 A1    Jul. 5, 2007

(30) Foreign Application Priority Data
Dec. 30, 2005   (TW) .............................. 94147579 A

(51) Int. Cl.
*H01L 21/00* (2006.01)
(52) U.S. Cl. .................. 438/149; 438/30; 438/151; 438/697
(58) Field of Classification Search ................. 438/149, 438/151, 157, 161, 197, 697
See application file for complete search history.

(56) References Cited

U.S. PATENT DOCUMENTS

| | | | |
|---|---|---|---|
| 6,784,032 B2 * | 8/2004 | Lee et al. | 438/149 |
| 2007/0002196 A1 * | 1/2007 | Chiu et al. | 349/43 |
| 2007/0096100 A1 * | 5/2007 | Lee et al. | 257/59 |

OTHER PUBLICATIONS

S.Wolf and T.N.Tauber, Silicon Processing for the VLSI Era, vol. 1, Lattice Press, 2000, pp. 488, 512, 537, 538.*

* cited by examiner

*Primary Examiner*—Bradley W Baumeister
*Assistant Examiner*—Julia Slutsker
(74) *Attorney, Agent, or Firm*—Bacon & Thomas PLLC

(57) ABSTRACT

A method for manufacturing a bottom substrate of a liquid crystal display device by using only three masks is disclosed. The method includes the following steps. First, a patterned first metal layer, an insulating layer, a semiconductor layer and a second metal layer are formed subsequently on a substrate. Afterwards, the second metal layer is manufactured to have two different thicknesses by using a photolithographic process. After that, a planar layer is formed on the second metal layer and then the planar layer is etched until part of the second metal layer is exposed. Finally, a patterned transparent electrode layer is formed on the second metal layer.

16 Claims, 2 Drawing Sheets

METHOD FOR MANUFACTURING A BOTTOM SUBSTRATE OF A LIQUID CRYSTAL DISPLAY DEVICE

BACKGROUND OF THE INVENTION

1. Field of the Invention

The present invention relates to a method for manufacturing a liquid crystal display device, and more particularly, to a method for manufacturing a bottom substrate of a liquid crystal display device.

2. Description of Related Art

In comparison with the cathode ray tube (CRT) monitors, the liquid crystal display device has the advantages of low power consumption, compact size, and non-radiation. However, the price of the thin film transistor liquid crystal display device (TFT-LCD) is relatively high. In particular, the manufacturing cost of the thin film transistor liquid crystal display device cannot to be further lowered, as the quantity of masks used in the photolithographic process for forming the transistor array of the liquid crystal display device cannot be reduced effectively.

The conventional method for manufacturing a thin film transistor array substrate uses five masks in its photolithographic processes. The first mask is used to define the first metal layer, and thereby forms the scan lines and the gate electrode of the thin film transistor. The second mask defines the channel layer and the ohmic contact layer of the thin film transistor. The third mask is used to pattern the second metal layer in order to form the data lines and the source and the drain electrodes of the thin film transistor. The fourth mask patterns the passivation layer. As for the fifth mask, it patterns the transparent electrode layer to form the pixel electrode.

As the liquid crystal display device tends to develop a thin film transistor liquid crystal display device having a larger display size, there are inevitably many problems, such as reduction in yield and capacity, to be solved. Therefore, if the quantity of masks used during the manufacturing of the thin film transistor can be reduced, i.e. reducing the quantity of the exposure processes, the manufacturing time can be reduced, the capacity can thus be increased, and the manufacturing cost is thereby lowered.

In addition, the photolithographic process used for the manufacturing of thin film transistor liquid crystal display device is quite expensive. Thus, reducing the photolithographic process can essentially lower the cost.

Therefore, it is desirable to provide an improved manufacturing method to mitigate and/or obviate the aforementioned problems.

SUMMARY OF THE INVENTION

The method for manufacturing a bottom substrate of a liquid crystal display device, according to the present invention, can reduce the quantity of masks used to simplify the manufacturing process, and decreases the manufacturing cost.

To achieve the object, the present invention provides a method for manufacturing a bottom substrate of a liquid crystal display device, which comprises the following steps. First, a substrate is provided, and then a patterned first metal layer, an insulating layer and a semiconductor layer are formed over the substrate, wherein the patterned first metal layer is interposed between the insulating layer and the substrate. After that, a second metal layer is formed on the semiconductor layer and then a photoresist layer is coated on the second metal layer. Afterwards, the photoresist layer is patterned by a photolithography process to form a first thickness and a second thickness, wherein the first thickness is different from the second thickness. Next, the photoresist layer and the second metal layer are etched to form a patterned second metal layer having a third thickness and a fourth thickness, wherein the third thickness is different from the fourth thickness. After that, a polymer layer is coated on the second metal layer, and then the polymer layer is cured to form a planar layer. Then, the planar layer is etched to expose part of the patterned second metal layer. Finally, a patterned transparent electrode layer is formed on the planar layer and the patterned second metal layer.

As a result, only three masks are required to manufacture a bottom substrate of a liquid crystal display device, according to the present invention. Due to the reduction of times of the exposure, the manufacturing time is shortened, the capacity is increased, and thus the manufacturing cost is effectively lowered. Further, the method of the present invention is also suitable for manufacturing the bottom substrate of the liquid crystal display device having a variety of source/drain electrodes designs.

In one embodiment of the present invention, the method further comprises a step of forming a passivation layer on the second metal layer after the patterned second metal layer is formed.

In one embodiment of the present invention, the method further comprises a step of removing an un-cured polymer layer after the curing is achieved.

In one embodiment of the present invention, part of the first metal layer is a gate electrode of a thin film transistor and part of the first metal layer is a lower electrode of an auxiliary capacitor. In the method of the present invention, part of the second metal layer is preferred to be an upper electrode of an auxiliary capacitor, and part of the second metal layer is preferred to be a source electrode or a drain electrode of a thin film transistor.

In the method of the present invention, the substrate can be any substrate. Preferably, the substrate is a glass substrate.

In the method of the present invention, the insulating layer can be any insulating layer. Preferably, the insulating layer is formed of a silicon oxide or silicon nitride.

In the method of the present invention, the semiconductor layer can be any semiconductor layer. Preferably, the semiconductor layer is an amorphous silicon layer.

In one embodiment of the present invention, the method further comprises a step of forming an ohmic contact layer on the semiconductor layer, and preferably the ohmic contact layer is an $N^+$ amorphous silicon layer.

In the method of the present invention, the transparent electrode layer can be any transparent electrode layer. Preferably, the transparent electrode layer is an IZO (Indium-Zinc-Oxide) layer or an ITO (Indium-Tin-Oxide) layer.

The mask used in the photolithography process of the method of the present invention is preferred to be a half-tone mask.

The difference of the third thickness and the fourth thickness of the patterned second metal layer is not limited. Preferably, the difference of the third thickness and the fourth thickness of the patterned second metal layer is about 1000 Å.

Other objects, advantages, and novel features of the invention will become more apparent from the following detailed description when taken in conjunction with the accompanying drawings.

DETAILED DESCRIPTION OF THE EMBODIMENT

Embodiment 1

With reference to FIGS. 1a to 1h, schematic flow charts of the embodiment of the present invention are shown.

Figure 1A:
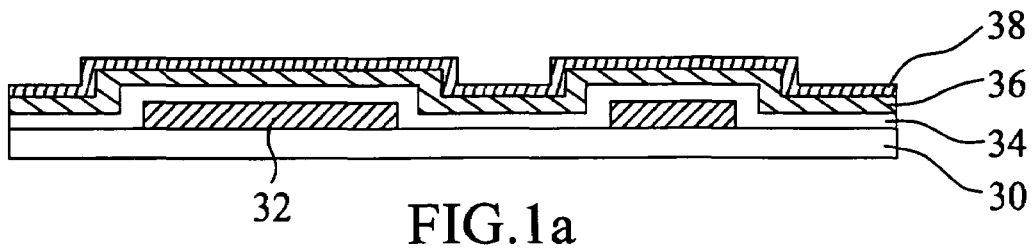
FIGS. 1a to 1h are perspective views showing the flowchart of a embodiment of the present invention.

The thin film transistor manufactured by the method of the present invention is a bottom gate thin film transistor. As shown in FIG. 1a, first, a substrate 30 is provided. The substrate 30 can be a glass substrate, a quartz substrate, or a plastic substrate. In the present embodiment, the substrate 30 is a glass substrate. Next, a patterned first metal layer 32, an insulating layer 34, a semiconductor layer 36, and an ohmic contact layer 38 are formed sequentially over the substrate 30. The first metal layer 32 serves as the gate electrode of the thin film transistor (TFT). On the other hand, there is still a part of the first metal layer 32 acting as a lower electrode of an auxiliary capacitor. The first metal layer 32 can have a single layer or multi-layer structure made of aluminum (Al), tungsten (W), chromium (Cr), copper (Cu), titanium (Ti), titanium nitride (TiNx), aluminum alloy, chromium alloy, or molybdenum (Mo). In the present embodiment, the first metal layer 32 is made of aluminum (Al), for example. The insulating layer 34 may be composed of silicon oxide ($SiO_x$), silicon nitride ($SiN_y$), or silicon oxynitride. In the present embodiment, the insulating layer 34 is made of silicon oxide ($SiO_x$), for example. The semiconductor layer 36 is an amorphous silicon (—Si) layer. As for the ohmic contact layer 38, it may be formed as a doped semiconductor, such as $n^+$—Si (n-type doped silicon).

Figure 1B:
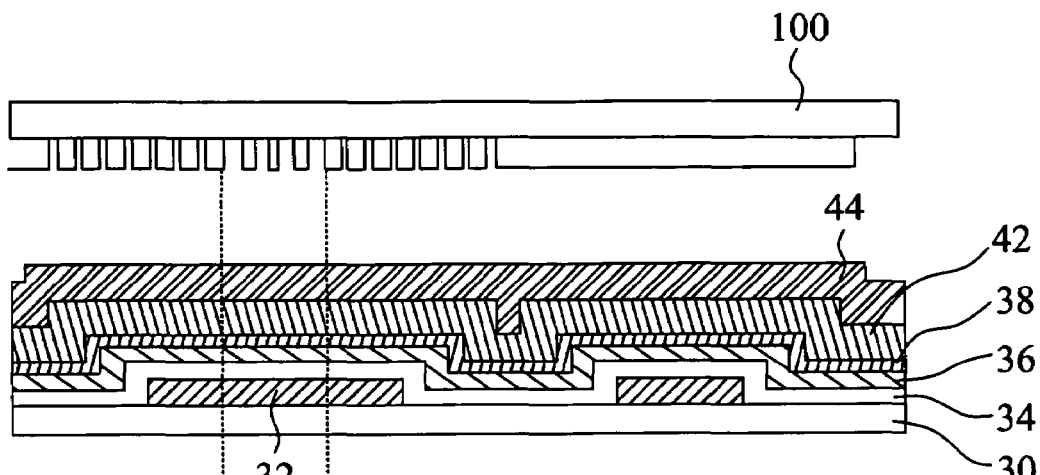
Figure 1C:
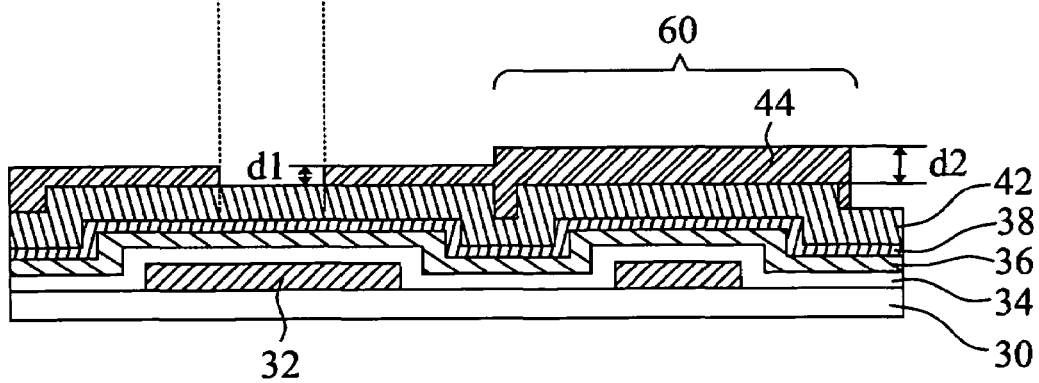

Afterwards, a second metal layer 42 and a first photoresist layer 44 are formed sequentially on the ohmic contact layer 38, as shown in FIG. 1b. After that, the first photoresist layer 44 is exposed through a half-tone mask 100 and then etched to produce difference in thickness. As a result, the thickness of the first photoresist layer 44 in the contact area 60 of the substrate is higher than that of the first photoresist layer 44 in the remaining area of the substrate, as shown in FIG. 1c. In the present embodiment, the first photoresist layer 44 has a first thickness (d1) in a first portion and a second thickness (d2) in a second portion, wherein the first thickness (d1) is less than the second thickness (d2).

Owing to the utilization of the half-tone mask 100, two portions with different thickness can be formed in the first photoresist layer 44 at the same time. Afterwards, two portions having different thickness can be formed in the second metal layer 42 by etching the first photoresist layer 44. Similar to the first metal layer 32, the second metal layer 42 may also have a single layer or multi-layer structure made of aluminum (Al), tungsten (W), chromium (Cr), copper (Cu), titanium (Ti), titanium nitride (TiNx), aluminum alloy, chromium alloy, or molybdenum (Mo). In the present embodiment, the second metal layer 42 is made of aluminum. The light source used in the exposure is not limited. In the present embodiment, the light source for exposure is ultraviolet light, for example.

Figure 1D:
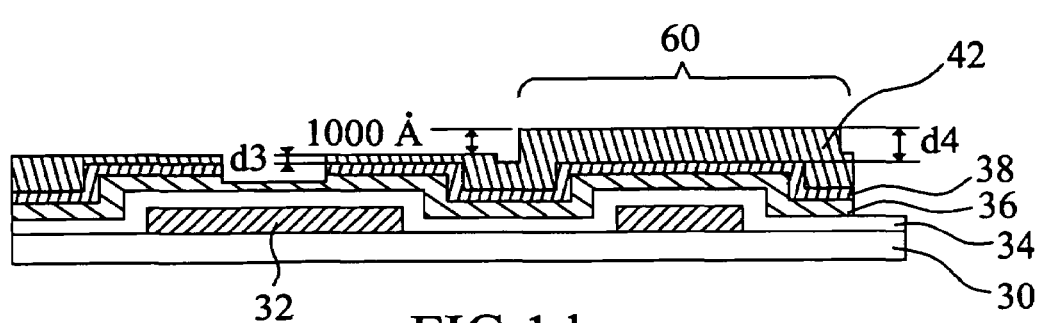

Next, as shown in FIG. 1d, the first photoresist layer 44 and the second metal layer 42 are etched to pattern the second metal layer 42. The patterned second metal layer 42 has a third thickness (d3) in a third portion and a fourth thickness (d4) in a fourth portion, wherein the third thickness (d3) is less than the fourth thickness (d4). As a result, the thickness of the second metal layer 42 in the contact area 60 of the substrate is greater than that of the second metal layer 42 in the remaining area of the substrate, wherein a height difference (d) thereof is formed. In the present embodiment, the height difference (d) of the second metal layer 42 is about 1000 Å, and the second metal layer predetermined to act as the contact area 60 is the highest. In the present embodiment, the fourth portion of the patterned second metal layer 42 may serve as an upper electrode of the auxiliary capacitor, and the third portion of the patterned second metal layer 42 may serve as the source electrode or the drain electrode of the thin film transistor.

Figure 1E:
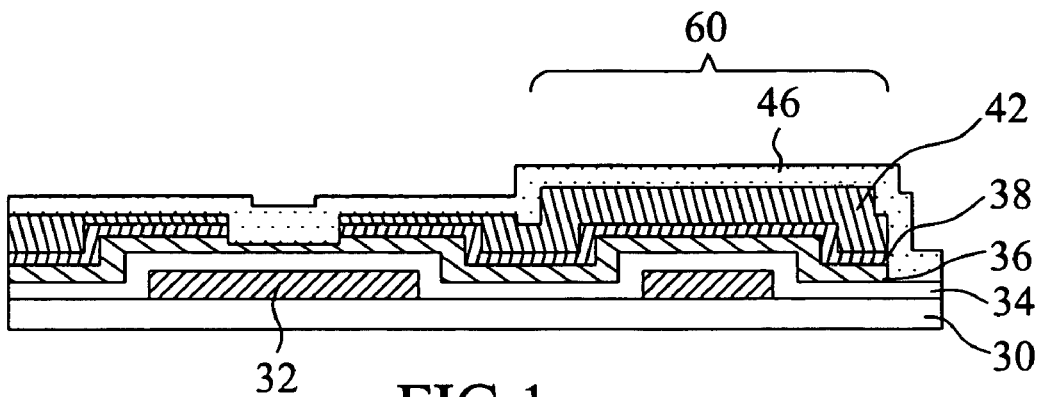
Figure 1F:
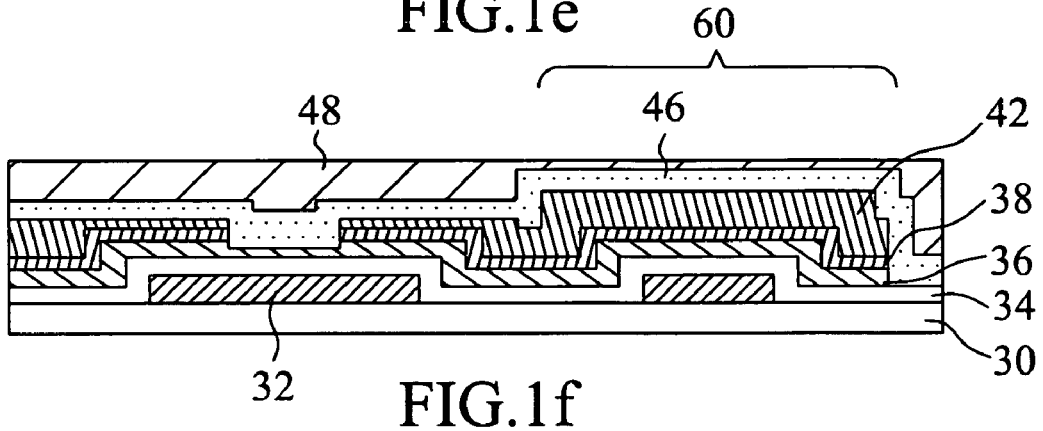

After that, a passivation layer 46 is formed on the second metal layer 42, as shown in FIG. 1e. Subsequently, the passivation layer 46 is coated with a planar second photoresist layer 48, which is then illuminated by an UV light for curing, as shown in FIG 1f. The material of the second photoresist layer 48 can be a polymeric photoresist, organic materials, or photoresists with high fluidity.

Figure 1G:
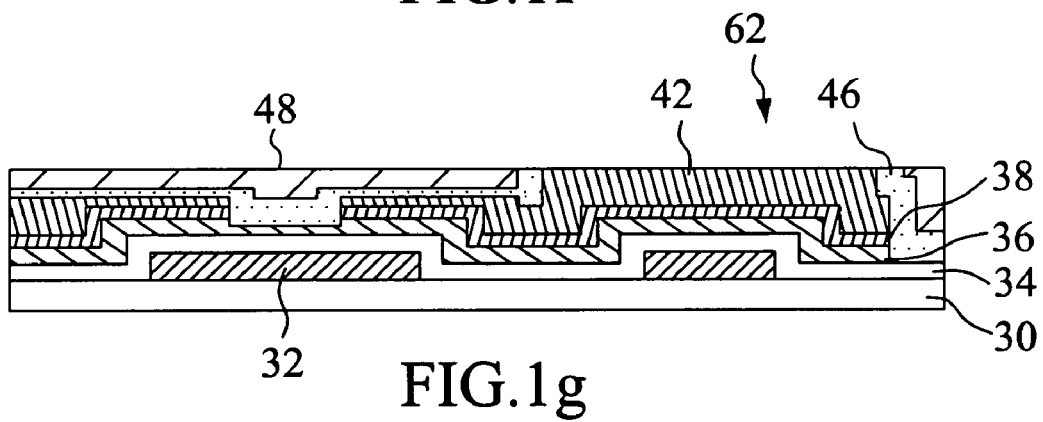

Afterwards, part of the second metal layer 42 is patterned by dry etching. The height difference (d) between the surface of the second metal layer is about 1000 Å, for example. Moreover, the second metal layer 42 in the contact area 60 is predetermined to have the greatest height. Since, the surface of the second metal layer 42 in the contact area 60 is the top surface, the second metal layer 42 in the contact area 60 will expose first in etching. In the present embodiment, the selection ratio of etching for the cured second photoresist layer 48 to the passivation layer 46 is 1:5, for example, and the end point of dry etching is set to be the contact with the second metal layer 42. As a result, the contact hole 62 is formed, as shown in FIG. 1g.

Since the top surface in the contact area 60 is the highest surface compared with that in other area, the second metal layer 42 in the contact area 60 may be exposed to form the contact hole 62 after an overall-back-etching in the present embodiment. Thus, no further photolithographic process is needed in the formation of the contact hole.

Figure 1H:
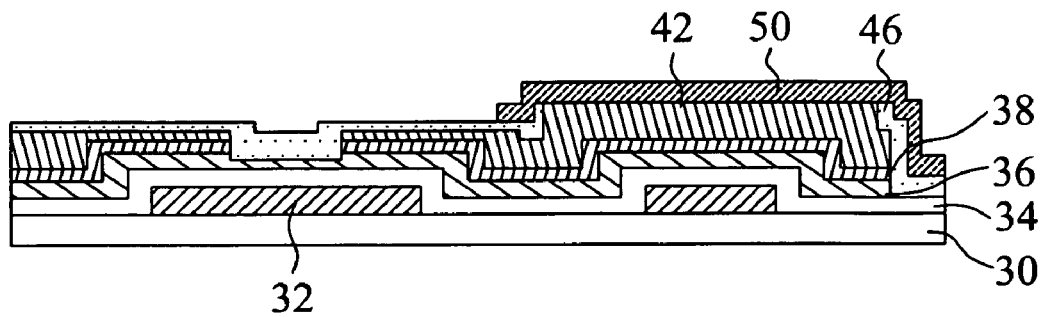

Then, the residual second photoresist layer 48 (cured photo sensitive polymer layer) is removed, and the passivation layer 46 under the residual second photoresist layer 48 still exists. As shown in FIG. 1h, a patterned transparent electrode layer 50 is then formed on the passivation layer 46 and the contact hole 62 (the exposed second metal layer 42). The transparent electrode layer 50 may be an IZO (Indium-Zinc-Oxide) layer or an ITO (Indium-Tin-Oxide) layer.

In conclusion, the manufacturing method proposed by the present embodiment needs only three photolithographic processes to fabricate the bottom substrate of the liquid crystal display device, and the yield thereof is raised. Thus, the display quality of the liquid crystal display device using the bottom substrate fabricated by the present invention is ensured.

Embodiment 2

The steps and the materials used in the present embodiment is the same as those in Embodiment 1 except the shape or the arrangement of the source/drain electrodes of the present embodiment is different from that of the Embodiment 1. The thin film transistor of the present embodiment is a U-type thin film transistor. By way of the utilization of the U-type transistor and other elements in the present embodiment, the current $I_{on}$ of the thin film transistor and the aperture ratio increase. Similarly, the bottom substrate of a liquid crystal display device can be made through the photolithography with three masks. By way of the method illustrated in the present embodiment, the yield can be improved. In addition, the display quality of the LCD can be improved, too.

Although the present invention has been explained in relation to its preferred embodiments, it is to be understood that many other possible modifications and variations can be made without departing from the scope of the invention as hereinafter claimed.

What is claimed is:

1. A method for manufacturing a bottom substrate of a liquid crystal display device, comprising:
    (A) providing a substrate;
    (B) forming a patterned first metal layer, an insulating layer and a semiconductor layer, wherein the patterned first metal layer is interposed between the insulating layer and the substrate;
    (C) forming a second metal layer on the semiconductor layer;
    (D) coating a photoresist layer on the second metal layer;
    (E) patterning the photoresist layer by a photolithography process, wherein the patterned photoresist layer has a first thickness in a first portion and a second thickness in a second portion, the first thickness is less than the second thickness;
    (F) etching the photoresist layer and the second metal layer to form a patterned second metal layer having a third thickness in a third portion and a fourth thickness in a fourth portion, wherein the third portion of the patterned second metal layer is a source electrode or a drain electrode of a thin film transistor, the fourth portion of the patterned second metal layer is an upper electrode of an auxiliary capacitor, the third thickness is less than the fourth thickness;
    (G) coating a polymer layer on the patterned second metal layer;
    (H) curing the polymer layer to form a planar layer;
    (I) etching the planar layer at the whole surface of the planar layer until the fourth portion of the patterned second metal layer being exposed; and
    (J) forming a patterned transparent electrode layer on the planar layer and the patterned second metal layer.

2. The method of claim 1, further comprising forming a passivation layer on the second metal layer after the patterned second metal layer is formed.

3. The method of claim 1, wherein the etching in step (F) is dry etching or wet etching.

4. The method of claim 1, wherein the photolithography process uses ultraviolet light.

5. The method of claim 1, wherein part of the first metal layer is a gate electrode of a thin film transistor.

6. The method of claim 1, wherein part of the first metal layer is a lower electrode of an auxiliary capacitor.

7. The method of claim 1, wherein the etching in step (I) comprises dry etching.

8. The method of claim 1, wherein the substrate comprises a glass substrate.

9. The method of claim 1, wherein the insulating layer is formed of silicon oxide or silicon nitride.

10. The method of claim 1, wherein the semiconductor layer comprises an amorphous silicon layer.

11. The method of claim 1, further comprising forming an ohmic contact layer on the semiconductor layer.

12. The method of claim 11, wherein the ohmic contact layer comprises an $N^+$ amorphous silicon layer.

13. The method of claim 1, wherein the transparent electrode layer comprises an IZO (Indium-Zinc-Oxide) layer or an ITO (Indium-Tin-Oxide) layer.

14. The method of claim 1, wherein the photolithography process applies a half-tone mask.

15. The method of claim 1, wherein the difference between the third thickness and the fourth thickness is about 1000 Å.

16. The method of claim 1, wherein the polymer layer is cured through illumination in step (H).

* * * * *